United States Patent [19]
Ward

[11] Patent Number: 5,417,877
[45] Date of Patent: May 23, 1995

[54] ORGANIC STRIPPING COMPOSITION

[75] Inventor: Irl E. Ward, Hatfield, Pa.

[73] Assignee: Ashland Inc., Ashland, Ky.

[21] Appl. No.: 983,257

[22] Filed: Nov. 30, 1992

Related U.S. Application Data

[63] Continuation-in-part of Ser. No. 647,487, Jan. 25, 1991, abandoned.

[51] Int. Cl.[6] ............................................. C09D 9/00
[52] U.S. Cl. ................................. 252/153; 252/171; 252/156; 252/158; 252/364; 252/DIG. 8; 134/38
[58] Field of Search ............... 134/38; 252/364, 548, 252/171, 153, DIG. 8, 162

[56] References Cited

U.S. PATENT DOCUMENTS

| | | | |
|---|---|---|---|
| 3,972,839 | 7/1976 | Murphy | 252/548 |
| 4,276,186 | 6/1981 | Bakos et al. | 252/158 |
| 4,539,230 | 9/1985 | Shimizu et al. | 427/230 |
| 4,737,195 | 4/1988 | Carandang et al. | 134/28 |
| 4,770,713 | 9/1988 | Ward | 134/38 |

*Primary Examiner*—Paul Lieberman
*Assistant Examiner*—Necholus Ogden
*Attorney, Agent, or Firm*—John Lezdey

[57] ABSTRACT

Organic stripping composition for photoresists comprising organic polar solvents and basic amines which includes an inhibitor which forms a coordination complex with a metal.

12 Claims, No Drawings

ORGANIC STRIPPING COMPOSITION

This is a continuation-in-part of application Ser. No. 07/647,487, filed Jan. 25, 1991, now abandoned.

FIELD OF THE INVENTION

The present invention relates to improved organic compositions containing organic polar solvents and basic amines which are useful as stripping agents in removing polymeric organic substances, such as photoresist from metallic substrates. More particularly, the invention provides a novel inhibition system which prevents corrosion and dulling of the metallic surface.

BACKGROUND OF THE INVENTION

During manufacture of semi-conductors and semi-conductor microcircuits, it is frequently necessary to coat the materials from which the semi-conductors and microcircuits are manufactured with a polymeric organic substance which is generally a photoresist, i.e. a substance which forms an etch resist upon exposure to light. Subsequently, the polymeric organic substance must be removed from the surface of the organic substrate which is typically a silicon dioxide coated silicon wafer and may also contain metallic microcircuitry, such as aluminum, on the surface. Therefore, there is a need for improved stripping compositions which will remove the polymeric organic substance from the coated inorganic substrate without corroding, dissolving or dulling the surface of the metallic circuitry or chemically altering the inorganic substrate.

Organic stripping agents comprising aromatic solvents and basic amines are known for removing organic substances from metallic inorganic substrates. While these stripping agents are effective in removing the polymeric substances, they also have the tendency, especially in the presence of water to corrode the metal, particularly copper, aluminum and titanium. It has been proposed in some organic stripping compositions to use hydrogen fluoride to reduce the rate of metal corrosion. However, hydrogen fluoride is harmful to the environment, attacks titanium and creates disposal problems.

Other known inhibitors such as β-napthol, glucose, resorcinol, pyrogallol and benzotriazole have been found to be ineffective to inhibit the pitting of copper when used with a stripping composition comprising organic polar solvents and basic amines.

U.S. Pat. No. 4,617,251 to Sizensky which is herein incorporated by reference, discloses a stripping composition in which the inhibitors of the present invention can be utilized.

British application No. 8428587 discloses stripping compositions comprising amides and amines which can be used with the inhibitors of the invention.

It is an object of this invention to provide improved organic stripping compositions which cleanly and efficiently remove organic photoresist materials from aluminized inorganic substrates, particularly aluminized silicon dioxide, without causing substantial etching of the inorganic substrate or corrosion and dulling of the metallic circuitry on the surface of the inorganic substrate, even after repeated use at elevated temperatures.

It is also an object of this invention to provide a method for removing polymeric organic substances from the surfaces of aluminized inorganic substrates, particularly aluminized silicon dioxide, without causing etching of the inorganic substrate or corrosion and dulling of the metallic circuitry on the surface of the inorganic substrate.

SUMMARY OF THE INVENTION

In accordance with the present invention there is provided a stripping composition comprising organic polar solvents and basic amines in combination with an inhibiting system which is effective in aqueous or non-aqueous stripping compositions.

The inhibitors which are used in connection with the present invention are those of the formulas:

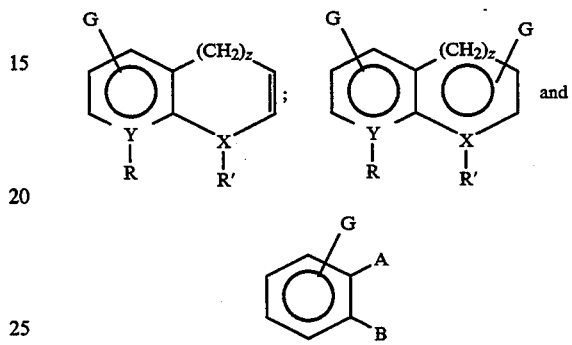

wherein X represents C, O, N, or S,
Y represents C, O, N, or S,
R represents —OH, —N″R″, —SR″, —NO, NO$_2$ or

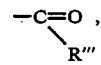

z is O or 1;
R' represents —OH, —NR,″R,″ —SR,″ —NO, NO$_2$ or

wherein
R″ represents H or lower alkyl, and
R‴ represents lower alkyl or lower alkoxy,
A and B each represent —OH; —COOR″; —SO$_2$NH$_2$ or —NH$_2$;
and G represents H, lower alkyl or halo.

Among the preferred inhibitors utilized in the invention are 8-amino-4H-chromene,
8-hydroxyquinoline,
8-amino 4H-1-benzofuran,
1-hydroxy-8-dialkylaminonaphthalene
1-hydroxy-8-dimethylaminonapthalene,
8-hydroxy-4H-1-benzothiopyran,
8-hydroxy-4H-1-benzothiofuran,
8-methylthiochroman,
8-ditertbutylamino chromene,
1-tertbutoxy-8-nitronaphthalene,
8-alkylketoquinoline,
8-sulfhydrylquinoline,
anthranilic acid,
8-nitrosoquinoline,
2-hydroxy benzene sulfonamide The inhibitor system of the present invention functions by forming a coordination complex with a metal. Complexation with a metal of a substrate occurs by coordination of the metal with the non-bonded electron pairs residing on the hetero-atoms of the inhibitor to form a stable 5 or 6-membered coordination rings for example of the general structure:

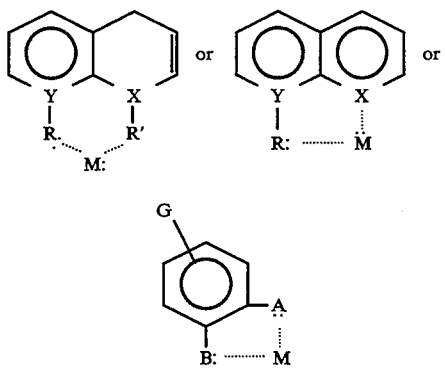

wherein X,Y,R,R', A, B, and G are as hereinbefore described, and M is a metal selected from the group consisting of Cr, Al, Zn, Ti, Ta, Ni, Cu, Ga, As and alloys thereof.

The inhibitor functions in a non-aqueous stripping composition to provide protection of substrates which have been sensitized toward corrosion by exposure to a chlorine or fluorine plasma. In an aqueous stripping composition there is protection of the metal substrate against corrosion caused by hydroxyl ions.

The stripping compositions of this invention comprise a mixture of (a) an amide compound of the formula:

   III and mixture thereof, wherein R is selected from the group consisting of hydrogen, lower alkyl and phenyl; $R_1$ and $R_2$ are selected from the group consisting of hydrogen and lower alkyl; and R and $R_1$ together with the keto and nitrogen group to which they are attached form a five or six membered ring, (b) an amine compound of the formula:

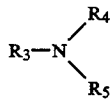   IV and mixtures thereof, wherein $R_3$ is selected from the group consisting of —$C_2H_5$, —$C_2H_4OH$, phenyl and $CH_2CH(OH)CH_3$, $R_4$ is selected from the group consisting of hydrogen lower alkyl, alkanol and phenyl, and $R_5$ is selected from the group consisting of hydrogen lower alkyl and —$C_2H_4OH$, and $R_3$ and $R_4$ together with the nitrogen group to which they are attached form a five or six membered ring, and, (c) about 0.5 to 20% by weight of an inhibitor.

If desired, the stripping composition can comprise up to 50% by weight of water, more preferably up to about 20%.

Also in accordance with this invention, there is provided a method for stripping a polymeric organic substance from a metallized inorganic substrate comprising contacting the polymeric organic substance with an organic stripping composition of this invention at a temperature of about 20° to about 180° C.

DETAILED DESCRIPTION OF THE INVENTION

The stripping compositions of this invention can comprise from about 50 to about 98%, preferably, from about 92 to about 98%, by weight of an amide or mixture of such amides of Formula III, from about 1 to about 49% by weight, preferably from about 1 to about 8%, of an amine compound or mixture of amines of Formula IV, and about 0.5 to 20% by weight, preferably from about 1 to 13% of an inhibitor.

As examples of suitable amide compounds of Formula III useful in the compositions of this invention, there may be mentioned, for example, N,N-dimethyl acetamide, N-methyl acetamide, N,N-diethyl acetamide, N,N-dipropyl acetamide, N,N-dimethyl propionamide, N,N-diethyl butyramide, N-methylpyrrolidinone, N-ethyl-2-pyrrolidinone and N-methyl-N-ethyl acetamide, and the like.

As examples of amine compounds of Formula IV useful in the compositions of this invention, there may be mentioned, for example, morpholine, 2-amino-picoline, bis (2-ethylhexyl) amine monoethanolamine, monopropanolamine, methylaminoethanol, etc.

Preferred stripping compositions of this invention comprise from about 94 to about 98% by weight N,N-dimethyl acetamide or N-methyl-N-ethylacetamide, from about 1 to about 8% by weight, monoethanolamine or monopropanolamine and from about 1 to about 13% by weight of inhibitor.

Especially preferred stripping compositions of this invention comprise a mixture comprising about 93% by weight N,N-dimethylacetamide or N-methyl-N-ethyl acetamide, about 5% by weight monoethanolamine and about 2% by weight of 8-hydroxyquinoline.

As exemplary stripping compositions of this invention there can be mentioned the following compositions of Table I.

TABLE I

| Component | Percent by Weight Composition | | | | | |
|---|---|---|---|---|---|---|
|  | A | B | C | D | E | F |
| Diethyl acetamide |  | 95.2 |  | 94 |  |  |
| Dimethyl acetamide | 97 |  | 74 |  | 80 | 95 |
| N-methyl-acetamide |  |  | 18 |  |  |  |
| Monomethanolamine | 1 | 2.8 | 5 |  |  | 3 |
| Monoethanolamine |  |  |  | 4 | 15 |  |
| 8-hydroxyquinoline | 2 | 2 | 3 | 2 | 5 | 2 |

The stripping compositions of this invention may also contain, if desired, any suitable water miscible nonionic detergent which does not adversely affect the stripping action of the compositions of this invention, generally in an amount of about 0.1 to about 2% by weight of the total composition.

The nonionic detergents which may be utilized can be of the three basic types—the alkylene oxide condensates, the amides and the semi-polar nonionicso Preferably, the nonionic detergent is an ethoxylated alkylphenol or alkylphenoxypoly (ethyleneoxy) ethanol, an ethoxylated aliphatic alcohol; polyoxyethylene, a carboxylic ester like a glycerol ester (mono- or di-), and other equivalent nonionic surfactants. Typical suitable ethoxylated alkylphenols are alkylphenols of $C_8$ to $C_{12}$ alkylphenols. It is most preferred that they be water soluble, those having at least 60 weight percent of polyoxyethylene groups being particularly well suited. Such ethoxylated alkylphenols are well known under various trademarks such as Igepal of GAF Corporation, Levelene, Neutronyx, Solar NP, the Surfonic series, and the Triton N and X series marketed by Rohm and Haas Co., just to name a few.

Among the polyoxyethylenes suitable for use in accordance with the invention are the mono- and dialkyl ethers of ethylene glycols and their derivatives. Typical of other nonionics are the monobutyl ether, ethylene glycol monobutyl ether acetate, ethylene glycol monoethyl ether acetate, ethylene glycol dibutyl ether, ethylene glycol monohexyl ether, ethylene glycol monomethyl ether, ethylene glycol monomethyl ether acetate, ethylene glycol monophenyl ether and other equivalent ethers of ethylene glycol. Another group of nonionics are the polyethylene glycols and the alkoxy derivatives, particularly lower alkoxy, such as methoxy polyethylene glycol; also diethylene glycols, propylene glocol and other similar glycols.

Preferred nonionics, by example, are Igepal DM 710 and CO-610 (GAF Corp.); Pluradot HA430, Plurafac RA-30 and -43, Pluronic L-62 and L-10 (BASF Wyandotte Co.); Poly-Tergent LF-405 and SLF-18 and SLF-45 (Olin Co.); Sandoxylate SX series (Sandoz Co.); Emulphogene BC series (GAF Corp).

Other suitable nonionic surfactants for use in the invention are disclosed in Kirk & Othmer, *Encyclopedia of Chemical Technology*, Vol. 19, pages 531 to 554, entitled "Nonionic Surfactants", which is incorporated herein by reference.

The stripping compositions of this invention are especially useful and advantageous for numerous reasons among which may be mentioned the following. The stripping compositions are water miscible, non-corrosive, non-flammable and of low toxicity to humans and the environment. Because of the low ambient vapor pressure of the compositions they evidence substantially less evaporation than prior compositions and are nonreactive and environmentally compatible. The stripping compositions may be recycled for multiple use or easily disposed of in an environmentally safe manner without the necessity for burdensome safety precautions. Likewise, a portion of the stripped coatings may be readily removed as solids and collected for easy disposal. The stripping compositions of this invention evidence higher stripping efficiency at lower temperatures for a wide variety of coatings and substrates. Moreover, the stripping compositions are easily prepared by simply mixing the components at room temperature and thus require no special human or environmental safety precautions. Furthermore, the components of the stripping compositions of this invention provide synergistic stripping action and permit readily and substantially complete removal of coatings from substrates.

EXAMPLE

A standard corrosion Solvent system was used to test a variety of inhibitors for corrosion prevention on two different metal substrates:
1) Pure 100% copper foil;
2) an Al/Cu (2%) metal alloy sputter deposited on top of a silicon substrate.

The standard corrosion solvent used was of the following formulation:

| | |
|---|---|
| Dimethylacetamide (DMA) | 94% (w/w) |
| Monoethanolamine (MEA) | 6% (w/w) |
| Surfactant | 0.2% added. |

Previous tests with the following solvents were performed to assess corrosion propensity on pure copper substrates. Attack was assessed by a change in color of the solvent to blue or blue-green indicating formation of a stable complex of oxidized (i.e. corroded) copper. The solvents included:
1) DMA
2) DMF
3) Tetrahydrofurfuryl alcohol (THFA)
4) Propylene Carbonate
5) N-Methylpyrrolidone (NMP)

None of the solvent is showed any effect on the Cu at all.

Several amines (i.e., which are known to form stable complexes with Cu and can be strong corrosives) were tested using the same color-change indicator as above. The tests are summarized below for exposures of 22 hrs.

| Component | Color | Rating* | Results |
|---|---|---|---|
| DMA | Clear | 0 | No attack |
| MEA | Light blue | 2-3 | Slight Cu attack |
| Morpholine | Light-mod. blue | 2-3 | Slight Cu attack |
| 1-amino-2 propanol | Moderate blue | 5 | Mod. Cu attack |
| tetramethyl-hydroxyamine | Deep blue | 10 | Heavy attack |
| Triethanolamine | Clear | 0 | No attack |
| 2-(2 aminoethoxy) ethanol | Blue-green | 5-6 | Mod. attack |
| 3-Methoxy-propylamine | Green | 4-5 | Mod. attack |
| 2-amino-3-picoline | Clear | 0 | No attack |

*Scale:
0→ No color change, no attack
10→ Deep opaque blue, heavy attack

These studies clearly point out that the amine in a formulation, is responsible for metal corrosion, not just for Cu, but for many different metals including Al, Ti, Cu, Cr, Al/Cu, W, etc. This fact is also established in standard electrochemical potentials of these metals, which show a greater propensity for metal oxidation (i.e. corrosion) in an $NH_3$ or $R-NH_2$ environment.

Therefore, to properly test the effectiveness of an "inhibitor" a reference solvent formulation encompassing both a corrosive amine and an inert solvent were used. The formulation mentioned above:

| | |
|---|---|
| DMA | 94% |
| MEA | 6% |
| Surfactant | 0.2% (added) | is employed and a wide selection of inhibitors tested for corrosion using three different methods of determination.
1) For Cu substrates, actual ICP (inductively coupled plasma) measurements of the copper extracted into the corrosive solution.

2) Microscopic examination of Cu surface before and after exposure to the test solution (i.e, reference formulation plus inhibitor).

3) DF/BF microscopic examination of "pitting" corrosion on Al/Cu alloy substrates before and after exposure to test solution.

INHIBITOR TEST DATA

| Inhibitor | Substrate | Test Method | Results |
|---|---|---|---|
| REF. BLANK | 100% Cu | (1) | 124 ppm |
| | | (2) | severe pitting, dull mat finish |
| | Al/Cu (2%) | (3) | large increase "black spot" pitting over unexposed pad (pitting over 100% of pads) |
| BENZO-TRIAZOLE | 100% Cu | (1) | 86 ppm |
| PYROGALLOL | 100% Cu | (1) | 10.4 ppm |
| | | (2) | high sheen, no pits |
| HYDRO-QUINONE | 100% Cu | (1) | 5.8 ppm |
| | | (2) | high sheen, some pitting (blotched intense pitting on 25% of pads) |
| | Al/Cu (2%) | (3) | Visual pitting increase on 80% pads. |
| RESORCINOL | Al/Cu (2%) | (3) | Visual pitting on 30% of pads. |
| B-NAPTHOL | Al/Cu (2%) | (3) | Severe pitting of >80% pads. |
| GLUCOSE | Al/Cu (2%) | — | Does not dissolve in Ref. blank. |
| 8-HYPHOXY-QUINOLINE | 100% Cu | (2) | high sheen, no pitting |
| | Al/Cu (2%) | (3) | No observable pits (<1% of pads show increase pitting over "before" subst.) |
| (BHT) Di-t-butyl hydroxy toluene | 100% Cu | (1) | 57 ppm (Ref. blank = 174 ppm) |
| | | (2) | Mod-severe blotching and substrate attack. |

What is claimed is:

1. A stripping composition for photoresists comprising:
   (a) from about 50 to 98% by weight of an amide compound of the formula:

III wherein R is selected from the group consisting of hydrogen, lower alkyl and phenyl; $R_1$ and $R_2$ are selected from the group consisting of hydrogen and lower alkyl; and R and $R_1$ together with the keto and nitrogen group to which they are attached form a five or six membered ring,
   (b) from about 1 to 49% by weight of an amine compound of the formula:

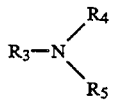

IV wherein $R_3$ is selected from the group consisting of —$C_2H_5$, —$C_2H_4OH$, phenyl and $CH_2CH(OH)CH_3$, $R_4$ is selected from the group consisting of hydrogen, lower alkyl, alkanol and phenyl, and $R_5$ is selected from the group consisting of hydrogen, lower alkyl and —$C_2H_4OH$, and $R_3$ and $R_4$ together with the nitrogen group to which they are attached form a five or six membered ring, and
   (c) about 0.5 to 20% by weight of 8 hydroxyquinoline.

2. In a stripping composition for photoresists which are associated with a metal or metal alloy substrate comprising:
   (a) from about 50 to 98% by weight of an amide compound of the formula:

III wherein R is selected from the group consisting of hydrogen, lower alkyl and phenyl, $R_1$ and $R_2$ are selected from the group consisting of hydrogen and lower alkyl; and R and $R_1$ together with the keto and nitrogen group to which they are attached form a five or six membered ring,
   (b) from about 1 to 49% by weight of an amine compound of the formula:

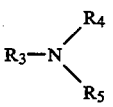

IV wherein $R_4$ is selected from the group consisting of —$C_2H_5$, —$C_2H_4OH$, phenyl and $CH_2CH(OH)CH_3$, $R_4$ is selected from the group consisting of hydrogen, lower alkyl, alkanol and phenyl, and $R_5$ is selected from the group consisting of hydrogen, lower alkyl and —$C_2H_4OH$, and $R_3$ and $R_4$ together with the nitrogen group to which they are attached form a five or six membered; ring, the improvement which comprises including about 0.5 to 20% by weight of 8-hydroxyquinoline, said 8-hydroxyquinoline being an inhibitor which forms a stable 5 or 6-membered coordination complex with a metal on said substrate selected from the group consisting of Al, Zn, Cr, Ti, Ta, Ni, Cu, Ga, As, and alloys thereof whereby said complex inhibits oxidation, of said substrate.

3. The stripping composition of claim 2 wherein said inhibitor is a heterocyclic compound.

4. The stripping composition of claim 3 wherein said heterocyclic compound is 8-hydroxyquinoline.

5. A process for removing a coating from a coated substrate comprising applying to said coated substrate a stripping effective amount of the composition of claim 1, for a stripping effective period of time and then removing the coating from the substrate.

6. A process for removing a coating from a coated substrate comprising applying to said coated substrate a stripping effective amount of the composition of claim 2, for a stripping effective period of time and then removing the coating from the substrate.

7. The composition of claim 1 including water.

8. The composition of claim 1 which is non-aqueous.

9. The composition of claim 1 wherein said amine is selected from the group consisting of monoethanol amine, N-methyl aminoethanol, methylethylamine, morpholine, 1-amino-2-propanol, 2-(2-aminoethoxyethanol), 3-methoxypropylamine, 2-amino-picoline and bis (2-ethylhexyl)amine.

10. The composition of claim 1 including up to about 2% by weight of nonionic detergent.

11. The composition of claim 1 comprising about 97% by weight of dimethylacetamide, about 1% by weight of diethanolamine and about 2% by weight of 8-hydroxyquinoline.

12. A process for removing a coating from a coated substrate comprising applying to said coated substrate a stripping effective amount of a stripping composition of claim 1, for a stripping effective period of time, and then removing the coating from the substrate.

* * * * *